(12) United States Patent
Terada

(10) Patent No.: US 7,864,894 B2
(45) Date of Patent: Jan. 4, 2011

(54) RECEIVER CIRCUIT AND RECEIVING METHOD

(75) Inventor: Makoto Terada, Kyoto (JP)

(73) Assignee: Rohm Co., Ltd. (JP)

( * ) Notice: Subject to any disclaimer, the term of this patent is extended or adjusted under 35 U.S.C. 154(b) by 575 days.

(21) Appl. No.: 11/959,866

(22) Filed: Dec. 19, 2007

(65) Prior Publication Data

US 2008/0159444 A1  Jul. 3, 2008

(30) Foreign Application Priority Data

Dec. 27, 2006  (JP) .............................. 2006-353151

(51) Int. Cl.
*H04L 27/08* (2006.01)
(52) U.S. Cl. ..................... 375/340; 375/376; 375/360; 327/144; 327/146; 327/151; 327/156; 327/241
(58) Field of Classification Search ................ 375/376, 375/340, 360, 354; 327/144, 146, 147, 151, 327/160, 156, 241
See application file for complete search history.

(56) References Cited

U.S. PATENT DOCUMENTS 6,956,923 B1 * 10/2005 Younis et al. ............... 375/375

2006/0056563 A1 *  3/2006 Aweya et al. ............... 375/376
2007/0087776 A1 *  4/2007 Terada et al. ............. 455/550.1

FOREIGN PATENT DOCUMENTS

JP    2004-519943    7/2004
JP    2006-518130    8/2006

OTHER PUBLICATIONS

Nick Sawyer: "Data Recovery", XILINX, Inc., US, Aug. 7, 2002.

* cited by examiner

*Primary Examiner*—David C Payne
*Assistant Examiner*—Rahel Guarino
(74) *Attorney, Agent, or Firm*—Cantor Colburn LLP

(57) ABSTRACT

Clock signals are supplied, with a phase shift of 1/n cycles between adjacent clock signals. A data acquisition unit acquires serial data at a timing of each of the clock signals. A phase detection unit detects the phase of the transition edge of the serial data using n bits of data. An effective bit number determination unit determines the effective bit number, which is the number of bits to be acquired, based upon the phase of the transition edge of the serial data in the current data-bit acquisition step and the phase of the transition edge of the serial data in the previous data-bit acquisition step. A data-bit output unit outputs the effective bit number of the bits of data acquired at a timing of each clock signal having a predetermined phase relation with the transition edge of the serial data.

6 Claims, 6 Drawing Sheets

RECEIVER CIRCUIT AND RECEIVING METHOD

BACKGROUND OF THE INVENTION

1. Field of the Invention

The present invention relates to a receiver circuit which receives serial data.

2. Description of the Related Art

In recent years, third generation cellular phone communication methods such as CDMA2000 (Code Division Multiple Access), W-CDMA (Wideband-CDMA), etc., have entered the mainstream. These communication methods provide communication at a remarkably high chip rate (or bit rate) as compared with second generation communication methods such as the GSM (Global System for Mobile communication) method, the PDC (Personal Digital Cellular) method, etc.

For example, the W-CDMA method, which is a third generation cellular phone communication method, requires transmission/reception of I/Q signals with a transmission data length of 10 bits and a reception data length of 8 bits between a digital baseband circuit (which will also be referred to simply as a "baseband circuit" hereafter) and an analog wireless communication unit (which will also be referred to as an "RFIC" hereafter) at a high speed of tens of MHz or more. With an arrangement in which parallel connection is provided between the baseband circuit and the RFIC, the baseband circuit and the RFIC must be connected to each other with several tens of signal lines. There is a large demand for small-sized cellular phone terminals. Accordingly, such an increase in the signal lines leads to a serious problem in cellular phone terminals.

In order to solve such a problem, as disclosed in Patent document 1, parallel/serial conversion is performed for 10-bit signals or 8-bit signals such that they are converted into high-frequency signals, thereby allowing the number of signal lines to be reduced.

[Patent Document 1]
PCT Japanese Translation Patent Publication No. 2004-519943

[Patent Document 2]
PCT Japanese Translation Patent Publication No. 2006-518130

However, the technique disclosed in Patent document 1 requires a synchronizing signal for identifying each bit stream, i.e., each word of data, which is used in a step of receiving serial data transmitted in a serial format. This requires additional signal lines. Such additional signal lines lead to an undesirable increase in the size of the set.

SUMMARY OF THE INVENTION

The present invention has been made in view of such problems. Accordingly, it is a general purpose of the present invention to provide a receiver circuit which asynchronously receives a serial transmission of a signal in a sure manner.

An embodiment of the present invention relates to a receiver circuit which receives serial data transmitted from a transmission circuit. The receiver circuit comprises: a clock generator which generates n (n represents an integer of 2 or more) clock signals at the same frequency as that of the serial data with a phase shift of 1/n cycles between the clock signals; a data acquisition unit which acquires the serial data at a timing of each of the n clock signals; a phase detection unit which detects the phase of the transition edge of the serial data using the n bits of data acquired by the data acquisition unit; an effective bit number determination unit which determines an effective bit number, which is the number of bits to be acquired, based upon the phase of the transition edge of the serial data in the current data-bit acquisition step and the phase of the transition edge of the serial data in the previous data-bit acquisition step; a data-bit output unit which receives the n bits of data acquired by the data acquisition unit, and which selects from among the n bits of data the effective bit number of the bits of data acquired at a timing of each clock signal having a predetermined phase relation with the transition edge of the serial data, and which outputs the bits of data thus selected; a counter which counts values that correspond to the effective bit numbers created every time the bits of data are acquired; a shift register which has stages, the number of which is greater than the number of bits of transmission unit of a serial data, and which sequentially stores the bits of data output from the data-bit output unit, with a variable shift amount which is adjusted according to the effective bit number; and a data output unit which determines the position of the first bit of the serial data in the bit stream stored in the shift register based upon the count value counted by the counter, and which outputs the serial data in a predetermined format.

With the above-described embodiment, the received bits of data are stored in the shift register having stages, the number of which is greater than the number of bits of transmission unit of the serial data (which will also be referred to simply as a "word" hereafter). Furthermore, the counter counts the number of bits acquired in a predetermined period of time, e.g., during clocks that correspond to the number of bits in one word. The shift register stores one word of bits of data to be extracted. In addition, the shift register stores redundant bits of data before and after the targeted one word of bits of data. Thus, such an arrangement allows the one word of bits of data to be extracted from the shift register at a predetermined timing in a sure manner by referring to the count value, even if there is a fluctuation between the phase of the clock signal and the phase of the serial data due to jitter etc.

Also, the shift register may output the stored bit stream in parallel at a predetermined timing. Also, the data output unit may include a barrel shifter which loads the bit stream thus output in parallel. Also, the barrel shifter may shift the bit stream thus loaded according to the count value counted by the counter, and may extract the same bit number of the bits of data as that of transmission unit of the serial data.

Also, an arrangement may be made in which, with the effective bit number as Y, the value (Y−1) is employed as the value that corresponds to the effective bit number, and the counter counts the values (Y−1) thus employed. With such an arrangement, the count value counted by the counter indicates the relative change in position of the bits of data stored in the shift register.

The receiver circuit may be monolithically integrated on a single semiconductor substrate. Examples of arrangements monolithically integrated include: an arrangement in which all the components of a circuit are formed on a semiconductor substrate; and an arrangement in which principal components of a circuit are monolithically integrated. With such an arrangement, a part of the resistors, capacitors, and so forth, for adjusting circuit constants, may be provided in the form of components external to the semiconductor substrate.

Another embodiment of the present invention relates to a wireless communication apparatus. The wireless communication apparatus comprises: a baseband circuit; a wireless communication unit; and an analog front-end circuit which serves as an interface between the baseband circuit and the wireless communication unit using low voltage differential signals. With such an arrangement, the baseband circuit performs up-sampling and interpolation of a transmission signal to be output to the wireless communication unit, then performs multi-order sigma-delta modulation of the transmission signal such that it is converted into serial data, and outputs the serial data thus converted to the analog front-end circuit. Furthermore, the analog front-end circuit includes the above-described receiver circuit, which receives the serial data output from the baseband circuit. Moreover, the analog front-end circuit integrates and performs down-sampling of the serial data thus received, then performs digital/analog conversion thereof, and outputs the analog signal thus converted to the wireless communication unit.

Such an embodiment allows the serial data output from the baseband circuit to be reproduced in a sure manner.

It is to be noted that any arbitrary combination or rearrangement of the above-described structural components and so forth are all effective as and encompassed by the present embodiments.

Moreover, this summary of the invention does not necessarily describe all necessary features so that the invention may also be sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

Best Mode for Carrying Out the Invention

The invention will now be described based on preferred embodiments which do not intend to limit the scope of the present invention but exemplify the invention. All of the features and the combinations thereof described in the embodiment are not necessarily essential to the invention.

Figure 1:
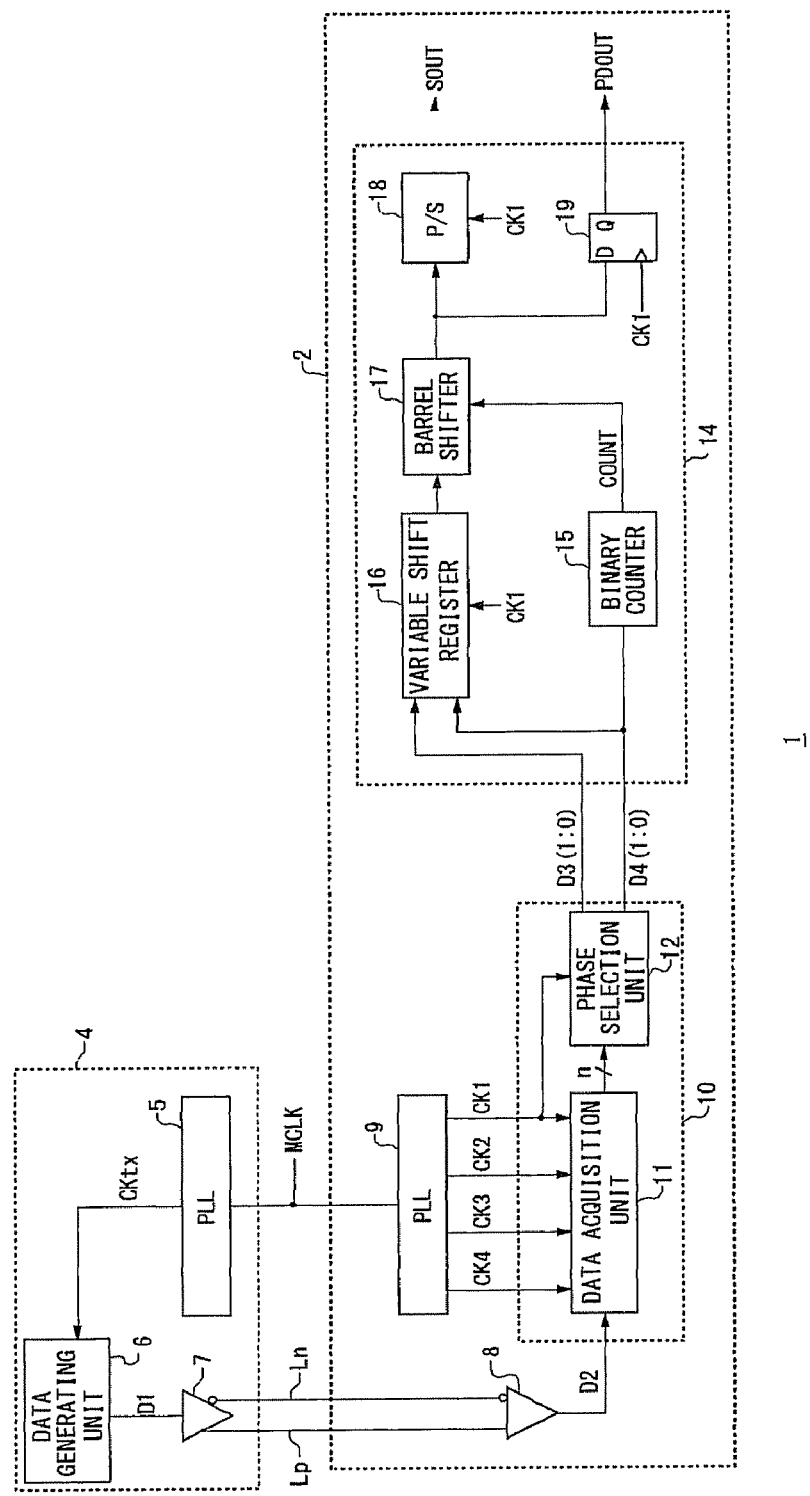
FIG. 1 is a block diagram which shows an overall configuration of a transmission/reception system according to an embodiment.

FIG. 1 is a block diagram which shows an overall configuration of a transmission/reception system 1 according to the present embodiment. The transmission/reception system 1 includes a receiver circuit 2 and a transmission circuit 4. In the circuit shown in FIG. 1, the receiver circuit 2 and the transmission circuit 4 perform transmission/reception of data via differential signal lines Lp and Ln using differential signals such as an LVDS (Low Voltage Differential Signal). It should be noted that the transmission method for providing communication between the receiver circuit 2 and the transmission circuit 4 is not restricted to the aforementioned differential transmission method. Rather, a desired method may be employed as a transmission method as long as serial data is employed. A master clock signal MCLK is supplied to each of the receiver circuit 2 and the transmission circuit 4.

First, description will be made regarding the configuration of the transmission circuit 4 side. The transmission circuit 4 includes a PLL (Phase Locked Loop) 5, a data generating unit 6, and a differential transmitter 7. The PLL 5 performs multiplication of the master clock signal, thereby creating the clock signal CKtx necessary for transmission of the serial data. The data generating unit 6 creates the serial data D1 to be transmitted based upon the clock signal CKtx. The differential transmitter 7 converts the serial data D1 into differential signals, which are output via the differential signal lines Lp and Ln.

Next, description will be made regarding the receiver circuit 2. The receiver circuit 2 according to the present embodiment receives the serial data D1 transmitted from the transmission circuit 4, reproduces the serial data D1 thus received, and outputs the data thus reproduced as the parallel data PDOUT or serial data SOUT.

The receiver circuit 2 includes a differential receiver 8, a clock generating unit 9, a data input unit 10, and a data compensation unit 14.

The differential receiver 8 amplifies the differential signals output from the differential transmitter 7, and converts the signals thus amplified into serial data (which will be referred to as "input serial data" hereafter) D2.

The clock generating unit 9 creates n (n represents an integer of 2 or more) clock signals with the same frequency as those of the serial data D1 and D2. In the present embodiment, four clock signals are created (i.e., n=4) with a 1/n cycle shift between the clock signals. The clock generating unit 9 may comprise a PLL or the like. Let us say that the clock signal CK1 is employed as the base clock signal. The clock signals with phase delays of 90 degrees, 180 degrees, and 270 degrees will be referred to as "clock signal CK2", "clock signal CK3", and "clock signal CK4", respectively.

With such an arrangement, the serial data D1 transmitted from the transmission circuit 4 is provided synchronously with the clock signal CKtx generated based upon the master clock signal MCLK. In addition, the clock signals CK1 through CK4 are also generated by performing multiplication of the master clock signal. However, such an arrangement cannot provide the clock signals CK1 through CK4 synchronously with the clock signal CKtx in a sure manner due to the jitter of the PLL. Furthermore, such an arrangement cannot ensure phase matching between the clock signal CK and the phase of the serial data D1 (D2) transmitted via the differential signal lines Lp and Ln. In such a situation, the receiver circuit 2 must have a function of precisely extracting each bit of data from the serial data D2 thus input.

The data input unit 10 receives the input serial data D2 and the clock signals CK1 through CK4 generated by the clock generating unit 9. The data input unit 10 includes a data acquisition unit 11 and a phase selection unit 12.

The data acquisition unit 11 acquires each bit of data of the input serial data D2 to be acquired at each timing of the n (=4) clock signals CK1 through CK4 (let us say hereafter that each bit of data is acquired at each positive edge timing). The bits of data acquired according to the clock signals CK1 through CK4 will be referred to hereafter as the respective "bit of data B1" through "bit of data B4". The data acquisition unit 11 outputs the bits of data B1 through B4 thus acquired, synchronously with the base clock signal CK1.

Figure 2:
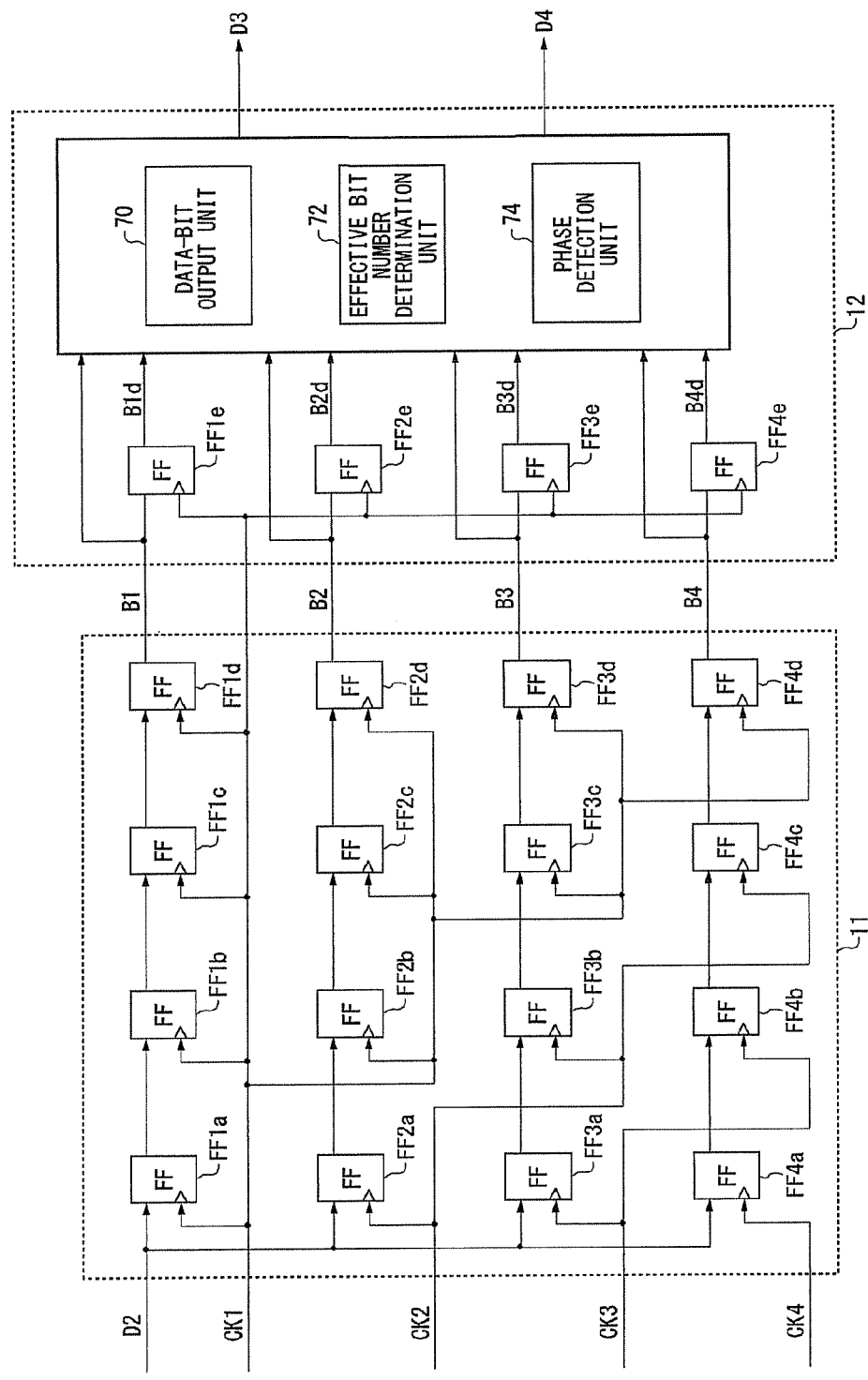
FIG. 2 is a circuit diagram which shows a configuration example of a data acquisition unit and a phase selection unit.

FIG. 2 is a circuit diagram which shows a configuration example of the data acquisition unit 11 and the phase selection unit 12.

The data acquisition unit 11 includes flip-flop units FFa through FFd in increments of clock signals CK1 through CK4, each of which include n (=4) cascaded flip-flops. The input serial data D2 is input to the D terminal (input terminal) of each of the first-stage flip-flops FF1a through FF4a. Furthermore, the clock signals CK1 through CK4 are input to the clock terminals of the first-stage flip-flops FF1a through FF4a, respectively. The first-stage flip-flops FF1a through FF4a latch the input serial data D2 at each positive edge timing of the clock signals CK1 through CK4.

The D terminal of the flip-flops FFia through FFid, which are downstream flip-flops of the first-stage flip-flops, receive the output data of the immediately upstream flip-flops FF(i−1)a through FF(i−1)d, respectively. Furthermore, each clock terminal of the flip-flops FFia through FFid receives a clock signal with a phase advanced by one unit from that of the clock signal supplied to the clock terminal of the immediately upstream flip-flop. It should be noted that the clock signal with a phase to be advanced by one unit from the base clock CK1 is set to the base clock signal CK1 itself.

With such an arrangement, each of the clock terminals of the fourth-stage flip-flops FF1d through FF4d receives the base clock signal CK1. The data acquisition unit 11 outputs the output data of the flip-flops FF1d through FF4d as the bits of data B1 through B4. That is to say, by means of the cascade of flip-flops, the bits of data are latched according to the respective clock signals CK1 through CK2 that differ from one another, and in the final stage, the bits of data thus latched are output at the positive edge timing of the base clock signal CK1.

The phase selection unit 12 receives n-bits (i.e. four bits) of data B1 through B4 and the base clock signal CK1 as input signals. The phase selection unit 12 includes flip-flops FF1e through FF4e, a data-bit output unit 70, an effective bit number determination unit 72, and a phase detection unit 74.

The flip-flops FF1e through FF4e latch the respective bits of data B1 through B4 thus input. The output data B1d through B4d output from the flip-flops FF1e through FF4e matches the bits of data B1 through B4 with a delay of one cycle of the base clock CK1. It should be noted that an arrangement may be made in which the flip-flops FF1d through FF4d are also employed as the flip-flops FF1e through FF4e. Such an arrangement has the advantage of a reduced circuit area.

The phase detection unit 74 detects the phase (timing) of the transition edge of the input serial data D2 using the n (=4) bits of data B1 through B4. The phase of the transition edge is represented by its relative relation to the clock signals CK1 through CK4.

Specifically, the phase detection unit 74 detects the transition edge of the input serial data D2 with reference to the four bits of data B1 through B4 acquired according to the respective n (=4) clock signals CK1 through CK4 and the corresponding delayed bits of data B1d through B4d. With such an arrangement, comparison is made between the bits of data B1 through B4 and the corresponding delayed bits of data B1d through B4d, and determination is made whether or not bit transition occurs, thereby detecting the transition edge.

The effective bit number determination unit 72 determines the effective bit number Y, which is the number of bits to be acquired, based upon the phase of the transition edge of the input serial data D2 in the current data-bit acquisition step and the phase of the transition edge of the input serial data D2 in the previous data-bit acquisition step.

The data-bit output unit 70 receives the effective bit number Y and the n (=4) bits of data B1 through B4 acquired by the data acquisition unit 11. The data-bit output unit 70 selects, from among the bits of data B1 through B4, Y bits of data having a predetermined phase relation with the transition edge of the input serial data D2. The bits of data thus selected are output.

Figure 3:
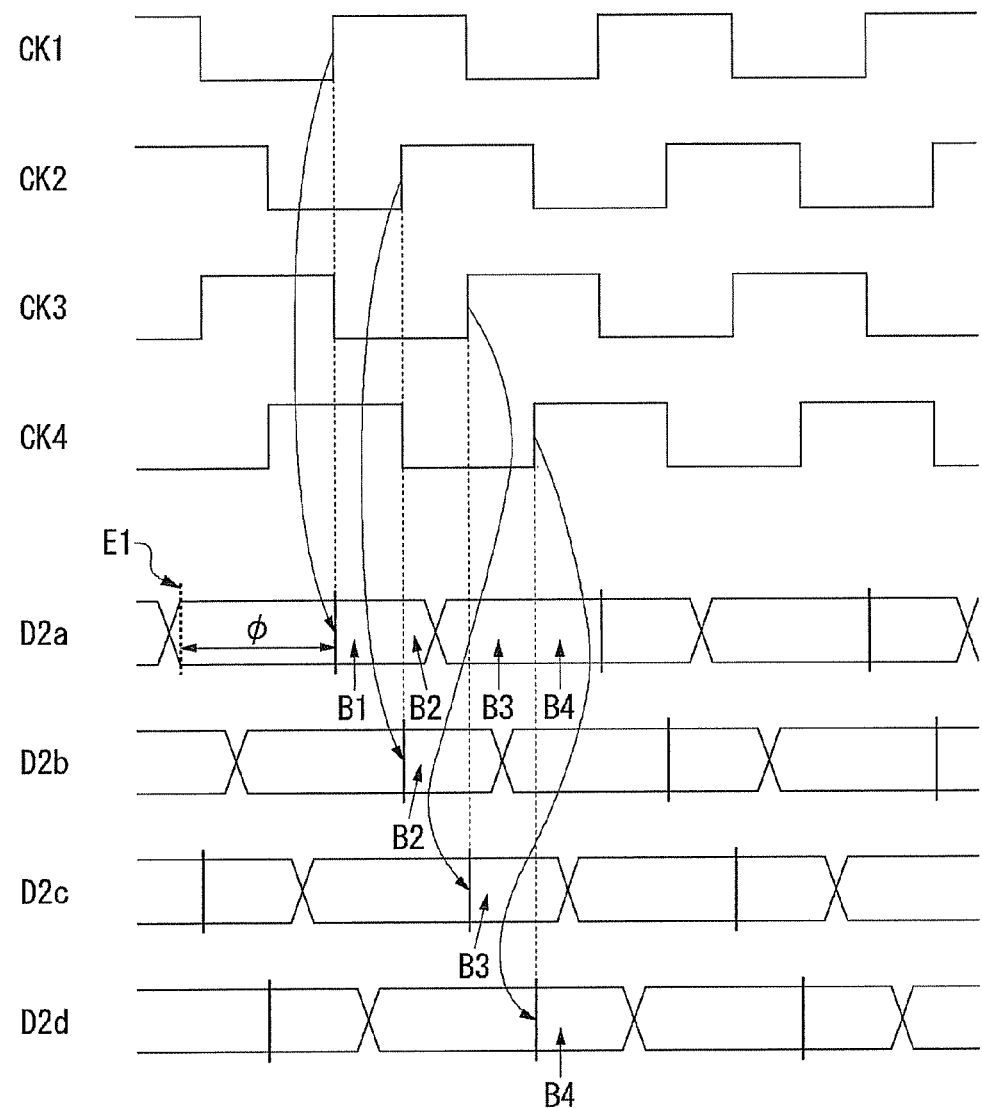
FIG. 3 is a timechart which shows the data acquisition operation of the phase selection unit shown in FIG. 2.

Description will be made below regarding the operation of the phase selection unit 12. FIG. 3 is a timechart which shows the data acquisition operation performed by the phase selection unit 12. Here, jitter and transmission delay occur independent of one another in the input serial data D2 and the clock signals CK1 through CK4. Accordingly, like the data-bit states D2a through D2d shown in FIG. 3, the phase relation can change between the transition edge of the input serial data and the clock signals CK1 through CK4.

The data-bit states D2a through D2d will be referred to as the respective "first state" through "fourth state" hereafter. In the first state, the transition edge of the input serial data D2 occurs between the positive edges of the clock signals CK2 and CK3. In the second state, the transition edge of the input serial data D2 occurs between the positive edges of the clock signals CK3 and CK4. In the third state, the transition edge of the input serial data D2 occurs between the positive edges of the clock signals CK4 and CK1. In the fourth state, the transition edge of the input serial data D2 occurs between the positive edges of the clock signals CK1 and CK2.

The data acquisition unit 11 acquires the data at the positive edge timing of each of the clock signals CK1 through CK4. FIG. 3 shows an example in which the four bits of data B1 through B4 are acquired from the input serial data D2a. In order to ensure that the input serial data D2 is acquired, there is a need to satisfy the condition of the set-up time and the hold time of each flip-flop. Accordingly, there is a need to select the latched bit of data using a clock signal having a predetermined phase relation with the transition edge of the input serial data giving consideration to the set-up time and the hold time of each flip-flop.

The aforementioned phase relation should be determined giving consideration to the set-up margin and the hold margin of each flip-flop. For example, for the transition edge E1 of the input serial data D2, such an arrangement may select a clock signal having a phase delay f of 180 degrees to 270 degrees.

If the input serial data D2 is in the D2a state, the clock signal CK1 is selected, and the bit of data B1 that corresponds to the clock signal CK1 is acquired. In the same way, if the input serial data D2 is in the D2x state (x represents b through d), the clock signal CKi (i represents 2 through 4) is selected, thereby acquiring the bit of data Bi (i represents 2 through 4) that corresponds to the clock signal CKi.

The effective bit number determination unit 72 determines the effective bit number Y based upon the phase relation between the transition edge of the input serial data D2 detected by the phase detection unit 74 (which will be referred to as the "current transition edge" hereafter) and the phase edge used in the immediately previous data acquisition step (which will be referred to as the "previous transition edge"). It should be noted that there is a one-to-one correspondence between the transition edge of the input serial data D2 and the bit of data to be acquired. Accordingly, in the following description, each of the current transition edge and the previous transition edge is also denoted by the reference numeral which denotes the bit of data to be acquired. For example, if the current transition edge is E1, the current transition edge will also be denoted by B1.

With such an arrangement, in a case in which the current transition edge En matches the previous transition edge Ep, the effective bit number Y is set to 1. In this state, the relative jitter is sufficiently small between the clock signal and the input serial data D2. Accordingly, in this case, a single bit of data is acquired in a single data acquisition step. That is to say, in a case in which change in the transition edge does not occur, i.e., in a case of (B1→B1), (B2→B2), (B3→B3), or (B4→B4), the effective bit number Y is set to 1, and a single bit of data is acquired in this data acquisition step. Here, the combination of the previous transition edge Ep and the current transition edge En is represented by (Ep→En).

In a case in which there is a phase difference of ±90 degrees between the previous transition edge Ep and the current transition edge En, the effective bit number Y is set as follows.

(1) If the transition edge changes without moving across the positive edge of the base clock signal CK1, the effective bit number Y is set to 1.

That is to say, in a case of (B1→B2), (B2→B1), (B2→B3), (B3→B2), (B3→B4), or (B4→B3), the effective bit number Y is set to 1.

(2) If the transition edge changes moving across the positive edge of the base clock signal CK1, the effective bit number Y is set to 0 or 2. Specifically, in a case of (B1→B4), the effective bit number Y is set to 0. On the other hand, in a case of (B4→B1), the effective bit number Y is set to 2.

The effective bit number Y is set to 0 in a case of (B1→B4), because, in this case, the data to be acquired is the same as that already acquired according to the clock signal CK1 in the previous data acquisition step. Accordingly, there is no need to acquire the data according to the clock signal CK4 in the current data acquisition step. In other words, in this case, there is no bit of data to be acquired.

On the other hand, in a case of (B4→B1), two bits of data can be acquired according to two kinds of clock signals.

The above is a description of the configuration and operation of the data input unit 10. Next, returning to FIG. 1, description will be made regarding the data compensation unit 14.

The phase selection unit 12 acquires Y (effective bit number) bits of data, and outputs the bits of data thus acquired in the form of two-bit data D [1:0]. In a case in which the effective bit number Y matches 0, the value 0 is stored in each of the bit D3[1] and the bit D3[0]. In a case in which the effective bit number Y matches 1, the value 0 is stored in the bit D3[1], and the bit of data thus acquired is stored in the bit D3[0]. In a case in which the effective bit number Y matches 2, the two bits of data thus acquired are stored in the bit D3[1] and the bit D3[0], respectively. Furthermore, the phase selection unit 12 outputs the effective bit number Y, which has been generated by the effective bit number determination unit 72, in the form of two-bit effective bit data D4[1:0].

The data compensation unit 14 includes a binary counter 15, a variable shift register 16, a barrel shifter 17, a parallel/serial converter 18, and an output flip-flop 19.

The binary counter 15 receives the effective bit number data D4 as input data. The binary counter 15 counts the values J that correspond to the effective bit numbers Y thus generated every time a bit of data is acquired. The value J that corresponds to the effective bit number Y is obtained by Expression J=Y−1.

The variable shift register 16 has L stages. Here, L, i.e., the number of stages, is greater than the bit number of transmission unit of the serial data. The number of stages L is preferably greater than the bit number K by 2 or more, and is more preferably greater than twice the bit number K. For example, in a case of K=8 bits, the variable shift register 16 having 16 stages (i.e., L=16) is employed. For example, in this case, the variable shift register 16 having 64 stages (i.e., L=64) may be employed. Description will be made below regarding an arrangement in which the variable shift register 16 having 16 stages (i.e., L=16) is employed. The variable shift register 16 sequentially stores the bits of data D3[1:0] output from the data-bit output unit 70. The variable shift register 16 employs a variable shift amount which is adjusted according to the effective bit number Y.

With such an arrangement, in a case of Y=0, the variable shift register 16 acquires neither of the two bits of the bits of data D3[1:0]. In a case of Y=1, of the two bits of the bits of data D3[1:0], the variable shift register 16 acquires only the bit D3[0]. In a case of Y=2, the variable shift register 16 acquires both of the two bits, i.e., D3[0] and D3[1] of the bits of data D3[1:0].

The data output unit comprises the barrel shifter 17, the parallel/serial converter 18, and the output flip-flop 19. This data output unit determines the position of the first bit of the serial data in the bit stream stored in the variable shift register 16 based upon the count value COUNT counted by the binary counter 15, and outputs the serial data in a predetermined format.

The variable shift register 16 outputs the stored L-bit bit stream in parallel at a predetermined timing. The barrel shifter 17 loads the bit stream thus output in parallel from the variable shift register 16. The barrel shifter 17 shifts the bit stream thus load based upon the count value counted by the binary counter 15, and extracts the K-bit (=8-bit) serial data. Here, K represents the number of bits of the serial data for each transmission.

The parallel/serial converter 18 is provided to an arrangement having a function of outputting the output data of the barrel shifter 17 in the form of parallel data. The parallel/serial converter 18 performs parallel/serial conversion of the output data of the barrel shifter 17 so as to sequentially output the data in increments of bits. The output flip-flop 19 is provided to an arrangement having a function of outputting the output data of the barrel shifter 17 in the form of serial data. An arrangement may be made as necessary including either the parallel/serial converter 18 or the output flip-flop 19.

Figure 4:
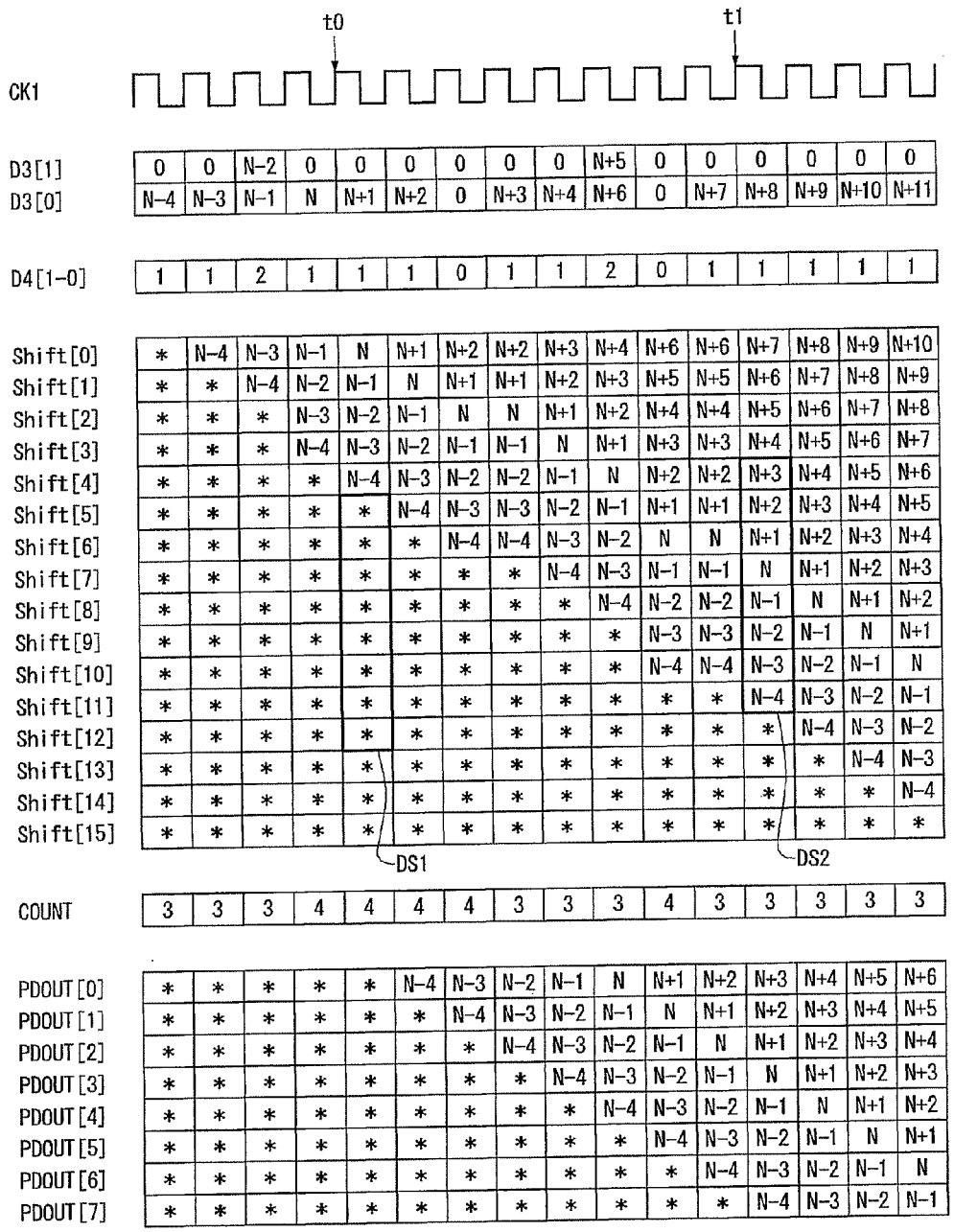
FIG. 4 is a timechart which shows the operation of a data compensation unit shown in FIG. 2.

FIG. 4 is a timechart which shows the operation of the data compensation unit 14 shown in FIG. 2. The horizontal axis in FIG. 4 represents time. Shift[0] through shift[15] represent the registers of the variable shift register 16. PDOUT[0] through PDOUT[7] correspond to the parallel data to be output, and represent the data selected by the barrel shifter 17.

At the point in time t0, the bits Shift[5:12] of the variable shift register 16 are selected, and the bits of data thus selected are output.

After the point in time t1, the variable shift register 16 acquires the data according to the effective bit number data D4[1:0] in increments of clocks CK1. In this example, the effective bit data numbers Y are 1, 1, 0, 1, 1, 2, 0, and 1 in order of time after the point in time t1. In this case, the values J that correspond to the effective bit data numbers Y are 0, −1, 0, 0, 1, −1, and 0. Accordingly, the count value COUNT of the binary counter 15 is 3 at the point in time t1, which is obtained by Expression 4+0+0 1+0+0+1−1+0=3.

In this example, while the count value COUNT is 4 at the point in time t0, the count value COUNT is 3 at the point in time t1. As described above, the count value COUNT indicates the first data to be acquired. Accordingly, in this case, the data compensation unit 14 selects the data set DS2 stored in the Shift[4:11] of the variable shift register 16, and outputs the data set thus selected.

As described above, the receiver circuit 2 according to the present embodiment can acquire the transmitted data in a sure manner even if the transition edge of the input serial data D2 fluctuates due to jitter etc. That is to say, the receiver circuit 2 according to the present embodiment has a function of outputting K bits of data every K cycles of the clock signal CK1. Thus, the receiver circuit 2 enables the data to be output at the same data transmission rate as that of the transmission circuit 4, i.e., as the data transmission speed at which one bit of data is output per every one clock CK1.

If the fluctuation of the transition edge of the input serial data D2 inclines in a given direction, the data stored in the variable shift register 16 repeatedly shifts in that direction. Accordingly, in such a case, with an arrangement in which the number of stages L of the variable shift register 16 is around the bit number K, it can be predicted that the bits of data, which are stored and are to be output, will overflow from the variable shift register 16. In order to solve such a problem, with the receiver circuit 2 according to the present embodiment, the number of stages L of the variable shift register 16 is equal to or greater than twice the bit number K. Such an arrangement eliminates the problem of overflow of the bits of data to be output from the variable shift register 16.

Description will be made regarding a preferable application example of the above-described transmission/reception system 1.

Figure 5:
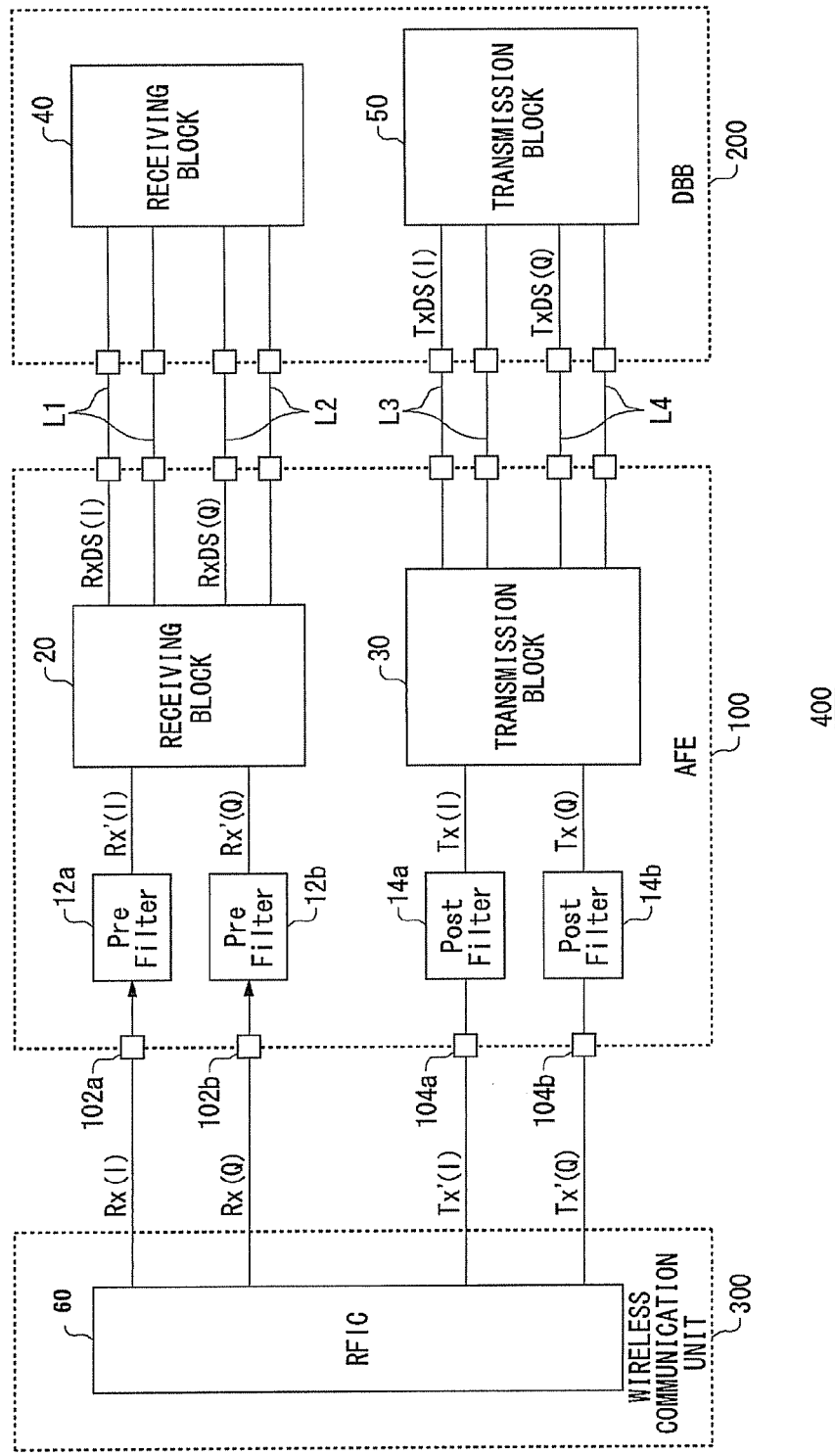
FIG. 5 is a block diagram which shows the configuration of a wireless communication apparatus according to an embodiment.

FIG. 5 is a block diagram which shows a configuration of a wireless communication apparatus 400 according to an embodiment of the present invention. Description will be made in the present embodiment regarding the wireless communication apparatus 400 which is a W-CDMA cellular phone terminal.

The wireless communication apparatus 400 includes an analog front-end circuit 100, a baseband circuit 200, and a wireless communication unit 300. The analog front-end circuit 100 is a circuit block which performs data transmission/reception between the baseband circuit 200 and the wireless communication unit 300. The analog front-end circuit 100 includes a receiving block 20, a transmission block 30, pre-filters 12a and 12b, and post-filters 14a and 14b. The baseband circuit 200 includes a receiving block 40 and a transmission block 50. The receiving block 20 of the analog front-end circuit 100 and the receiving block 40 of the baseband circuit 200 perform data transmission/reception in cooperation with each other. Also, the transmission block 30 of the analog front-end circuit 100 and the transmission block 50 of the baseband circuit 200 perform data transmission/reception in cooperation with each other.

First, description will be made regarding the flow of the reception signals and transmission signals in the wireless communication apparatus 400 according to the present embodiment.

The wireless communication unit 300 includes an RFIC 60, an unshown amplifier circuit such as a power amplifier or the like, and an antenna. The RFIC 60 amplifies an RF reception signal received via the unshown antenna, and performs frequency conversion so as to obtain an IF reception signal having an intermediate frequency (which will be referred to as the "IF frequency" hereafter). The IF reception signal having the IF frequency thus converted is amplified by an automatic gain control (AGC) amplifier. Then, quadrature detection is performed on the IF signal thus amplified such that it is decomposed into an I component and a Q component, thereby outputting the I component signal and the Q component signal as the reception signals Rx(I) and Rx(Q). The reception signals Rx(I) and Rx(Q) are input to the input terminals 102a and 102b of the analog front-end circuit 100, and the frequency bands thereof are limited by the pre-filters 12a and 12b.

The receiving block 20 of the analog front-end circuit 100 performs analog/digital conversion of the received signals Rx'(I) and Rx'(Q), performs sigma-delta modulation so as to obtain a bit stream signal, and performs conversion so as to obtain the low voltage differential signals RxDS(I) and RxDS(Q), which will be described later in detail. The low voltage differential signals RxDS(I) and RxDS(Q) are output to the baseband circuit 200 via differential signal lines L1 and L2.

The baseband circuit 200 performs sigma-delta demodulation of the bit stream signal thus input in the form of the low voltage differential signal RxDS(I) and RxDS(Q). Subsequently, a demodulator included within the baseband circuit 200 performs inverse spreading of the bit stream signal thus subjected to sigma-delta modulation, thereby reproducing the data.

Furthermore, the transmission block 50 of the baseband circuit 200 performs data modulation using a modulator included therewithin so as to map the I component and the Q component, and outputs the chip data stream thus spreaded. The chip data stream is subjected to sigma-delta modulation such that it is converted into a bit stream signal. Subsequently, the bit stream signal thus converted is further converted into the low voltage differential signals TxDS(I) and TxDS(Q), which are transmitted to the analog front-end circuit 100 via differential signal lines L3 and L4. The transmission block 30 of the analog front-end circuit 100 performs sigma-delta demodulation of the bit stream signal input in the form of the low voltage differential signals TxDS(I) and TxDS(Q), and performs digital/analog conversion, thereby outputting these signals to the wireless communication unit 300 in the form of the transmission signals Tx(I) and Tx(Q).

The frequency bands of the transmission signals Tx(I) and Tx(Q) thus subjected to digital/analog conversion are limited by an analog filter (not shown) and the post filters 14a and 14b, thereby outputting these signals as the signals Tx'(I) and Tx'(Q) to the RFIC 60.

The RFIC 60 performs quadrature detection of the transmission signals Tx'(I) and Tx'(Q) with the IF frequency, and converts these transmission signals thus subjected to the quadrature detection into a 2-GHZ-band RF signal. The RF signal thus converted is amplified by a downstream power amplifier (not shown), and is transmitted via the antenna in the form of a radio wave.

Figure 6:
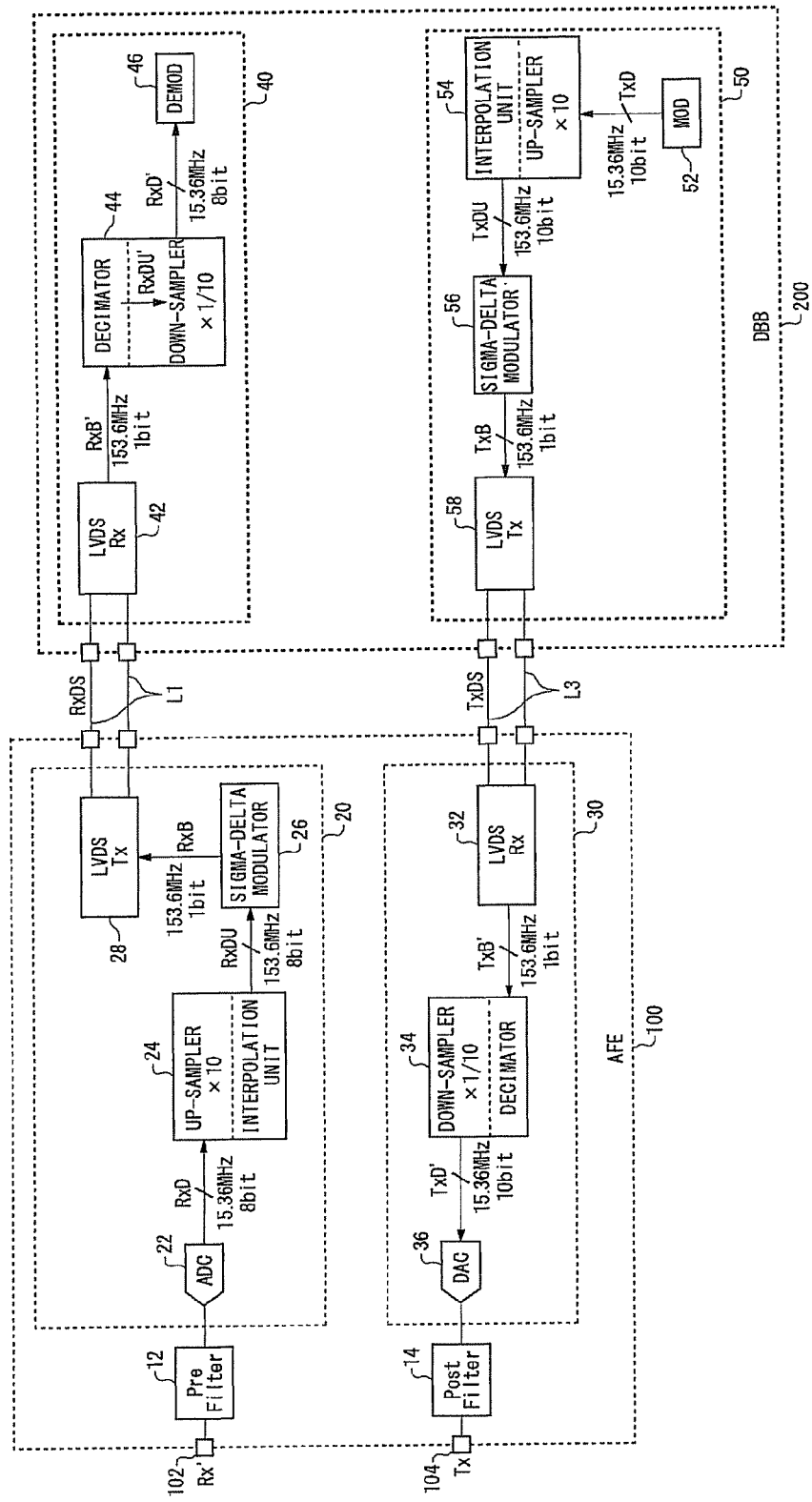
FIG. 6 is a block diagram which shows an internal configuration of an analog front-end circuit and a baseband circuit shown in FIG. 5.

Next, detailed description will be made regarding the internal configurations of the analog front-end circuit 100 and the baseband circuit 200. FIG. 6 shows a block diagram which shows the internal configurations of the analog front-end circuit 100 and the baseband circuit 200 shown in FIG. 5. FIG. 6 shows only one of the I component/Q component for convenience of description. In practice, such an arrangement includes components for both the I component and the Q component. Furthermore, for simplification, the reference symbols (I) and (Q), which are used for labeling the I component and the Q component, are omitted.

As described above, the analog front-end circuit 100 can be differentiated into the receiving block 20 and the transmission block 30. The baseband circuit 200 can be differentiated into the receiving block 40 and the transmission block 50. First, description will be made regarding the configurations of the receiving block 20 of the analog front-end circuit 100 and the receiving block 40 of the baseband circuit 200.

The receiving block 20 of the analog front-end circuit 100 includes an analog/digital converter 22, an interpolation unit 24, an sigma-delta modulator 26, and a low voltage differential signal transmitter 28 (which will be referred to as the "LVDS transmitter 28" hereafter).

The analog/digital converter 22 performs analog/digital conversion with a resolution m=8 bits, at a base sampling rate fs of 15.36 MHz, on the analog reception signal Rx' which has been output from the wireless communication unit 300 and has been input to the input terminal 102.

The interpolation unit 24 is a so-called interpolation filter, which performs up-sampling at a frequency ten times that of the base sampling rate fs, and performs data interpolation. The interpolation unit 24 outputs a digital signal RxDU at a sampling rate fs'=153.6 MHz with a resolution of 8 bits.

The sigma-delta modulator 26 performs multi-order (second or more) sigma-delta modulation of the digital signal RxDU output from the interpolation unit 24. In the present embodiment, the sigma-delta modulator 26 is a fourth-order sigma-delta modulator. From the point of view of the signal precision, the sigma-delta modulator is preferably on the order of three or more. Furthermore, mainly from the point of view of the circuit area, the sigma-delta modulator is preferably on the order of five or less. Accordingly, the order of the sigma-delta modulator 26 should be selected from the range between the order of three and the order of five as appropriate based upon the up-sampling rate fs'/fs and the required signal precision.

The sigma-delta modulator 26 outputs at a frequency of 153.6 MHz a 1-bit bit stream signal RxB subjected to sigma-delta modulation. This bit stream signal RxB is input to the LVDS transmitter 28. The LVDS transmitter 28 converts the bit stream signal RxB into the low voltage differential signals RXDS, which are transmitted to the baseband circuit 200 via the differential signal lines L1.

Next, description will be made regarding the configuration of the receiving block 40 of the baseband circuit 200. The receiving block 40 of the baseband circuit 200 includes a low voltage differential signal reception unit (which will be referred to as the "LVDS receiver 42"), a decimation circuit 44, and a demodulator 46.

The LVDS receiver 42 receives, from the analog front-end circuit 100 via the differential signal lines L1, the 1-bit low voltage differential signal RxDS subjected to sigma-delta modulation. The LVDS receiver 42 converts the low voltage differential signal RxDS into a bit stream signal RxB'.

The decimation circuit 44 is a so-called decimation filter, which integrates the bit stream signal RxB' output from the LVDS receiver 42, and which performs down-sampling at a base sampling rate fs=15.36 MHz on the bit stream signal RxB' thus received. The decimation circuit 44 outputs an output signal RxD' with a resolution of 8 bits at a frequency of 15.36 MHz. The demodulator 46 demodulates the output signal RxD' of the decimation circuit 44 using a predetermined method.

Next, description will be made regarding the configurations of the transmission block 50 of the baseband circuit 200 and the transmission block 30 of the analog front-end circuit 100.

The transmission block 50 of the baseband circuit 200 includes a modulator 52, an interpolation unit 54, an sigma-delta modulator 56, and an LVDS transmitter 58.

The modulator 52 outputs, with a resolution of 10 bits at a frequency of 15.36 MHz, the digital transmission signal TxD that has been subjected to data modulation using a predetermined method. The digital transmission signal TxD thus output from the modulator 52 is input to the interpolation unit 54.

The interpolation unit 54 performs up-sampling and interpolation on the digital transmission signal TxD such that it is converted into a digital transmission signal TxDU at a frequency of 153.6 MHz with a resolution of 10 bits. The sigma-delta modulator 56 performs sigma-delta modulation of the digital transmission signal TxDU output from the interpolation unit 54. Like the sigma-delta modulator 26 of the analog front-end circuit 100, the order of the sigma-delta modulator 56 is preferably three or more. With the present embodiment, the baseband circuit 200 is designed to include the fourth-order sigma-delta modulator 56.

The LVDS transmitter 58 converts the bit stream signal TxB output from the sigma-delta modulator 56 into the low voltage differential signals TxDS, and outputs the low voltage differential signals TxDS thus converted to the analog front-end circuit 100 via the differential signal lines L3.

Next, description will be made regarding the configuration of the transmission block 30 of the analog front-end circuit 100. The transmission block 30 of the analog front-end circuit 100 includes an LVDS receiver 32, a decimation circuit 34, and a digital/analog converter 36.

The LVDS receiver 32 receives the low voltage differential signals TxDS output from the baseband circuit 200, and converts the low voltage differential signals TxDS thus received into a bit stream signal TxB'. The decimation circuit 34 integrates the bit stream signal TxB' thus received by the LVDS receiver 32, and performs down-sampling. The decimation circuit 34 outputs a digital signal TxD' with a resolution of 8 bits at a frequency of 15.36 MHz.

The digital/analog converter 36 performs digital/analog conversion of the output signal TxD' of the decimation circuit 34, and outputs the analog transmission signal Tx to the wireless communication unit 300 via the output terminal 104.

The transmission block 50 of the baseband circuit 200 and the transmission block 30 of the analog front-end circuit 100 thus configured convert the digital transmission signal TxD generated by the baseband circuit 200 into a one-bit digital signal subjected to multi-order sigma-delta modulation, and transmit the digital signal thus converted to the analog front-end circuit 100 in the same way as with the above-described receiving block 20 and the receiving block 40. Such an arrangement allows the number of signal lines that connect the analog front-end circuit 100 and the wireless communication unit 300 to be reduced. Furthermore, such an arrangement does not require high-precision synchronous processing between the analog front-end circuit 100 and the baseband circuit 200, thereby providing a simple circuit design.

The receiver circuit 2 and the transmission circuit 4 described in the embodiment are applicable to circuits having the functions of the LVDS receiver 42 and the LVDS transmitter 28 shown in FIG. 6. Also, the LVDS receiver 32 and the LVDS transmitter 58 shown in FIG. 6 may comprise the receiver circuit 2 and the transmission circuit 4 according to the embodiment.

It should be noted that the usage of the receiver circuit 2 according to the embodiment is not restricted to the wireless communication apparatus 400. Rather, the receiver circuit 2 according to the embodiment may be applicable to various kinds of parallel transmission between electronic devices or ICs that differ from one another.

While the preferred embodiments of the present invention have been described using specific terms, such description is for illustrative purposes only, and it is to be understood that changes and variations may be made without departing from the spirit or scope of the appended claims.

What is claimed is:

1. A receiver circuit which receives serial data transmitted from a transmission circuit, comprising:
   a clock generator which generates n (n represents an integer of 2 or more) clock signals at the same frequency as that of the serial data with a phase shift of 1/n cycles between the clock signals;
   a data acquisition unit which acquires the serial data at a timing of each of the n clock signals;

a phase detection unit which detects the phase of the transition edge of the serial data using the n bits of data acquired by said data acquisition unit;

an effective bit number determination unit which determines an effective bit number, which is the number of bits to be acquired, based upon the phase of the transition edge of the serial data in the current data-bit acquisition step and the phase of the transition edge of the serial data in the previous data-bit acquisition step;

a data-bit output unit which receives the n bits of data acquired by said data acquisition unit, and which selects from among the n bits of data the effective bit number of the bits of data acquired at a timing of each clock signal having a predetermined phase relation with the transition edge of the serial data, and which outputs the bits of data thus selected;

a counter which counts values that correspond to the effective bit numbers created every time the bits of data are acquired;

a shift register which has stages, the number of which is greater than the number of bits of transmission unit of the serial data, and which sequentially stores the bits of data output from said data-bit output unit, with a variable shift amount which is adjusted according to the effective bit number; and a data output unit which determines the position of the first bit of the serial data in the bit stream stored in said shift register based upon the count value counted by said counter, and which outputs the serial data in a predetermined format.

2. A receiver circuit according to claim 1, wherein said shift register outputs the stored bit stream in parallel at a predetermined timing, and wherein said data output unit includes a barrel shifter which loads the bit stream thus output in parallel, and wherein said barrel shifter shifts the bit stream thus loaded according to the count value counted by said counter, and extracts the same bit number of the bits of data as that of transmission unit of the serial data.

3. A receiver circuit according to claim 1, wherein, with the effective bit number as Y, the value (Y−1) is employed as the value that corresponds to the effective bit number, and wherein said counter counts the values (Y−1) thus employed.

4. A receiver circuit according to claim 1, which is monolithically integrated on a single semiconductor substrate.

5. A wireless communication apparatus comprising:
a baseband circuit;
a wireless communication unit; and
an analog front-end circuit which serves as an interface between said baseband circuit and said wireless communication unit using low voltage differential signals, wherein said baseband circuit performs up-sampling and interpolation of a transmission signal to be output to said wireless communication unit, then performs multi-order sigma-delta modulation of the transmission signal such that it is converted into serial data, and outputs the serial data thus converted to said analog front-end circuit, and wherein said analog front-end circuit includes said receiver circuit according to claim 1, which receives the serial data output from said baseband circuit, and wherein said analog front-end circuit integrates and performs down-sampling of the serial data thus received, then performs digital/analog conversion thereof, and outputs the analog signal thus converted to said wireless communication unit.

6. A receiving method for receiving serial data transmitted from a transmission circuit, comprising:

generating n (n represents an integer of 2 or more) clock signals at the same frequency as that of the serial data with a phase shift of 1/n cycles between the clock signals;

acquiring the serial data at a timing of each of the n clock signals;

detecting the phase of the transition edge of the serial data using the n bits of data acquired in said data acquisition;

determining an effective bit number, which is the number of bits to be acquired, based upon the phase of the transition edge of the serial data in the current data-bit acquisition step and the phase of the transition edge of the serial data in the previous data-bit acquisition step;

selecting, from among the n bits of data thus acquired, the effective bit number of the bits of data acquired at a timing of each clock signal having a predetermined phase relation with the transition edge of the serial data, and outputting the bits of data thus selected;

counting values that correspond to the effective bit numbers created every time the bits of data are acquired;

sequentially storing the bits of data output in said data-bit output processing utilizing a shift register which has stages, the number of which is greater than the number of bits of transmission unit of a serial data;

adjusting the variable shift amount of said shift register according to the effective bit number; and determining the position of the first bit of the serial data in the bit stream stored in said shift register based upon the count value thus counted, and outputting the serial data in a predetermined format.

* * * * *